United States Patent
Tsuji et al.

[11] Patent Number: 5,958,562
[45] Date of Patent: Sep. 28, 1999

[54] PRINTED CIRCUIT BOARDS

[75] Inventors: Hitoshi Tsuji, Sagamihara; Koji Nishi, Yokohama, both of Japan

[73] Assignee: Murata Manufacturing Co., Ltd., Japan

[21] Appl. No.: 08/726,747

[22] Filed: Oct. 7, 1996

[30] Foreign Application Priority Data

Oct. 13, 1995 [JP] Japan ................................. 7-265440

[51] Int. Cl.⁶ ................ B32B 3/00; H05K 1/00
[52] U.S. Cl. ............... 428/209; 174/250; 174/252; 174/263; 428/901; 361/748
[58] Field of Search .................. 428/209, 901; 361/748; 174/250, 252, 263

[56] References Cited

U.S. PATENT DOCUMENTS

| | | | |
|---|---|---|---|
| 3,330,695 | 7/1967 | Curran | 428/209 |
| 3,568,312 | 3/1971 | Perricone | 29/625 |
| 3,708,876 | 1/1973 | Klehm, Jr. | 29/625 |
| 4,826,720 | 5/1989 | Wade | 428/209 |
| 5,252,383 | 10/1993 | Fukutake et al. | 428/209 |
| 5,283,107 | 2/1994 | Bayer et al. | 428/209 |
| 5,288,541 | 2/1994 | Blackwell et al. | 428/209 |
| 5,408,053 | 4/1995 | Young | 174/264 |

FOREIGN PATENT DOCUMENTS

| | | |
|---|---|---|
| 287681 | 10/1988 | European Pat. Off. . |
| 982405 | 2/1965 | United Kingdom . |

OTHER PUBLICATIONS

Patent Abstracts of Japan, vol. 18, No. 560, Oct. 26, 1994 & JP 6–204628, Jul. 22, 1994.

Primary Examiner—Deborah Jones
Assistant Examiner—Cathy F. Lam
Attorney, Agent, or Firm—Ostrolenk, Faber, Gerb & Soffen, LLP

[57] ABSTRACT

On a surface of an insulating board, a front wiring pattern is formed. On the rear surface of the insulating board, opposing the front wiring pattern, a rear wiring pattern is formed in a shape which is substantially plane-symmetrical to the front wiring pattern. An opening which penetrates the front wiring pattern and the rear wiring pattern is formed. At the inner wall of the opening, an electrically conductive layer is formed. Inside the opening, solder, for example, is placed to form an electrically conductive filling. As a result, the front wiring pattern and the rear wiring pattern are positively connected to each other electrically. Therefore, the current capacity and the heat capacity of the wiring patterns are increased, and the amount of generated heat is reduced.

26 Claims, 2 Drawing Sheets

PRINTED CIRCUIT BOARDS

BACKGROUND OF THE INVENTION

1. Field of the Invention

The present invention relates to printed circuit boards for use in electronic apparatus.

2. Description of the Related Art

Most electronic components used for an electronic apparatus are densely mounted on a printed circuit board and are connected to each other through wiring patterns formed on the printed circuit board.

A typical printed circuit board used for an electronic apparatus is defined by a copper-coated laminated plate including an insulating board made, for example, by dipping glass cloth formed of glass fiber in epoxy resin and by putting copper foil on the front and rear surfaces of the insulating board. An insulating board having a specified thickness of about 0.1 mm to 0.2 mm is used. The copper foil generally used is relatively inexpensive and relatively thin (18, 35, or 70 $\mu$m). A printed circuit board formed by thin copper foil has a good yield due to easy copper-foil etching and is manufactured at a relatively low cost.

In a wiring pattern on a printed circuit board used for the secondary circuit of a switching power unit, for example, a large current flows when a small load resistance is connected to the output of the secondary circuit. As a result, the pattern on the printed circuit board generates resistance losses, that is copper loss, and heat is generated in the pattern. The heat generated in the pattern affects the surrounding electronic components and, for example, changes the temperature characteristics of the electronic components. When the pattern is widened to reduce copper loss, it requires a larger printed circuit board, resulting in a larger electronic apparatus.

SUMMARY OF THE INVENTION

Accordingly, it is an object of the present invention to provide a printed circuit board which solves the above-described problems.

The foregoing object is achieved according to the present invention through the provision of a printed circuit board including: an insulating board; a front wiring pattern formed on the front surface of the insulating board; a rear wiring pattern formed on the rear surface of the insulating board correspondingly to all or part of the front wiring pattern; at least one opening penetrating through the insulating board and through corresponding opposed portions of the front wiring pattern and the rear wiring pattern; an electrically conductive layer provided at the inner wall of the opening; and an electrically conductive filling with which the opening section is filled.

The front wiring pattern and the rear wiring pattern may be disposed such that they entirely oppose each other, or only partially oppose each other.

Preferably there are a plurality of such openings.

With this configuration, the electrically conductive filling with which the openings are filled positively connects the front wiring pattern with the rear wiring pattern. The current capacity of the wiring patterns is reliably increased and copper loss is reduced. In addition, the electrically conductive filling is highly heat conductive and the heat capacity of the wiring pattern increases with the result that the electrically conductive filling serves as a heat sink and heat generated by the front wiring pattern is suppressed.

Therefore, effects caused by heat on electric components mounted around the wiring patterns are reduced and the reliability of the electronic apparatus increases. Since there is no need to change the widths of the wiring patterns, compactness of the electronic apparatus is maintained.

The openings may be provided at a plurality of positions along the longitudinal direction defined by the opposed front wiring pattern and rear wiring pattern.

With this configuration, since the electrically conductive layers and the generally column-shaped, electrically conductive fillings serve as current paths between the front wiring pattern and the rear wiring pattern, a current flows through both wiring patterns, and the column-shaped electrically conductive fillings work as heat sinks.

The openings may alternatively be configured such that they are long and narrow and extend along said longitudinal direction, and are provided side-by-side across the transverse direction defined by the front wiring pattern and the rear wiring pattern.

With this configuration, since the electrically conductive layers and the electrically conductive fillings themselves serve as current paths, the current capacity of the wiring patterns increases. In addition, the volume of the electrically conductive fillings is greater than in the first embodiment and they work more effectively as heat sinks.

DESCRIPTION OF EMBODIMENTS OF THE INVENTION

Figure 1:
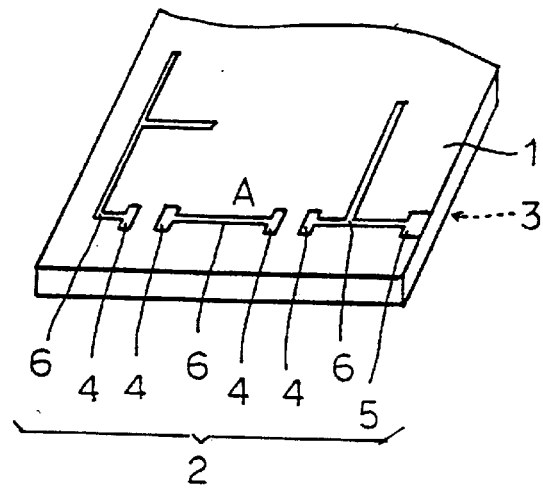
FIG. 1 is a part of a perspective view of a printed circuit board according to a first embodiment of the present invention.
Figure 2A:
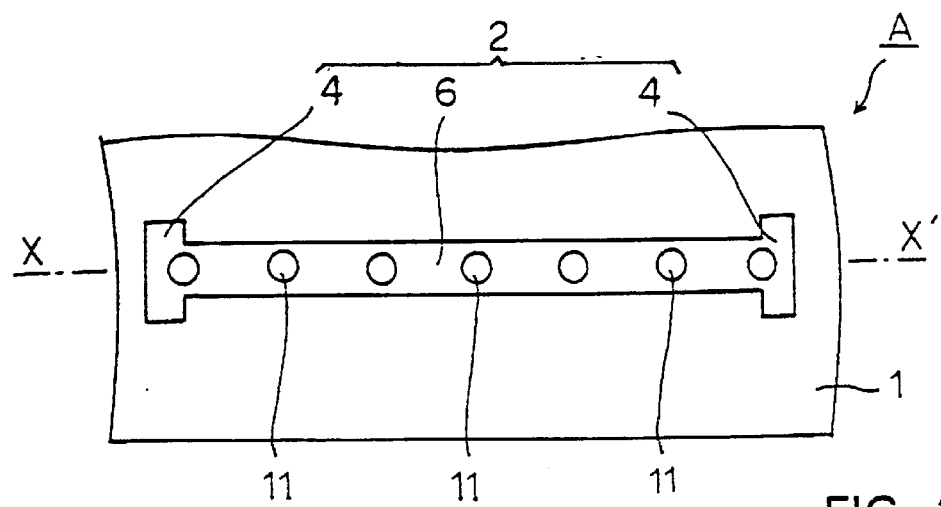
FIG. 2A is a part of an enlarged top view of a typical wiring pattern formed on the front surface of the printed circuit board according to the first embodiment of the present invention.
Figure 2B:
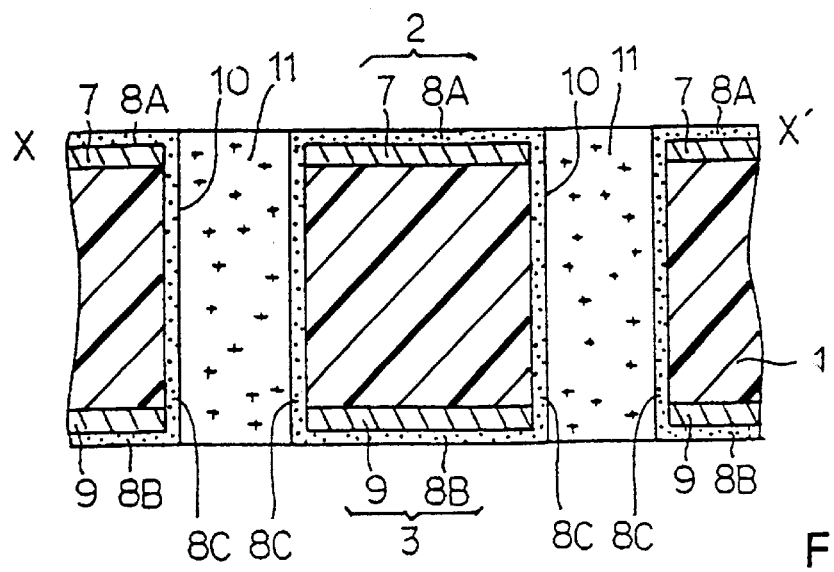
FIG. 2B is a part of an enlarged view of a cross section taken on line X–X' shown in FIG. 2A.

A first embodiment of the present invention will be described below with reference to FIGS. 1 and 2. FIG. 1 is a perspective view showing a part of a printed circuit board. FIGS. 2A and 2B are enlarged views of a part A of the wiring pattern shown in FIG. 1.

The printed circuit board includes a conventional insulating board 1, a front wiring pattern 2, and a rear wiring pattern 3.

The front wiring pattern 2 includes lands 4 for mounting components, terminals 5, and leads 6 for connecting lands 4 and terminals 5 to each other. The front wiring pattern 2 comprises a front copper-foil pattern 7 which is formed by etching copper foil provided on the front surface of the insulating board 1, and a plated layer 8A (FIGS. 2(A) and 2(B)) with which the front copper-foil pattern 7 is laminated at the front surface.

The rear wiring pattern 3 is formed at the rear surface of the insulating board 1, which is opposite the front wiring pattern 2, in a shape which is substantially plane-symmetrical to the front wiring pattern 2. Like the front wiring pattern 2, the rear wiring pattern 3 is formed by a rear copper-foil pattern 9 and a plated layer 8B.

The insulating board 1 is provided with a plurality of openings 10 which penetrate the front wiring pattern 2 and the rear wiring pattern 3, in the longitudinal direction of the front wiring pattern 2. The openings 10 may have any shape, such as a circle, an ellipse, a quadrilateral, or a triangle. At the inner walls of the openings 10, electrically conductive layers, such as plated layers 8C, are provided. As a result, the front wiring pattern 2 and the rear wiring pattern 3 are electrically connected to each other through the plated layers 8C. The openings 10 are formed by using a laser beam, by cutting physically, or by punching with the use of a metal die. It is preferred that the maximum dimension of a opening section be several millimeters.

The openings 10 are filled, for example, with solder 11 to form column-shaped electrically conductive fillings. The solder 11 is placed in the openings 10, for example, by dipping the rear wiring pattern 3 of the printed circuit board in a molten-solder bath. To prevent the solder 11 from sticking to the surface of the rear wiring pattern 3, a solder resist layer (not shown) is provided in advance. When the pattern is dipped into the solder bath, the plated layers 8C at the inner walls of the openings 10 become wet with the molten solder 11, and the molten solder 11 travels upward into the openings 10 by capillary action. Then, the printed circuit board is cooled. The molten solder 11 becomes hard and the openings 10 are filled with the solder 11. Therefore, the solder 11 does not stick to the surface of the rear wiring pattern 3 and the printed circuit board can be made thin.

As a result, the front wiring pattern 2 and the rear wiring pattern 3 are positively connected by the solder 11 electrically, and the current capacity of the wiring patterns made up of the front wiring pattern 2 and the rear wiring pattern 3 is reliably increased and the copper loss of the wiring patterns is reduced. The heat capacity of the wiring patterns increases due to the solder 11 located in the opening 10 which serves as a heat sink to decrease the heat generated by the front wiring pattern 2.

In the first embodiment, the current capacity of the entire area of the front wiring pattern 2 is made larger. In an alternate embodiment, only a part of the front wiring pattern 2 may be provided with openings 10 and conductive fillings 11, whereby the current capacity may be only partially increased. Even in this case, since heat generated by a part of the front wiring pattern 2 is reduced, the amount of heat generated by the whole printed circuit board is also reduced.

Also, in the first embodiment, the rear wiring pattern 3 is formed in a plane-symmetrical manner to the front wiring pattern 2, and they are positively connected by the solder 11. However, in another alternate embodiment, the printed circuit board may alternatively be configured such that the rear wiring pattern 3 is formed plane-symmetrically to only a selected part of the front wiring pattern 2, where a large current flows, and this part of the front wiring pattern 2 is positively connected to the rear wiring pattern 3 by the electrically conductive fillings. In this case, heat generated by the part of the front wiring pattern 2, where a large current flows, is reduced.

In addition, if it is acceptable for the printed circuit board to be made thicker, the solder resist layer may be eliminated in order to allow the solder 11 to adhere to the rear wiring pattern 3. In that case, the current capacity of the wiring patterns becomes even larger.

A plurality of printed circuit boards which are formed in this way may be stacked to form a multilayer printed circuit board.

Figure 3A:
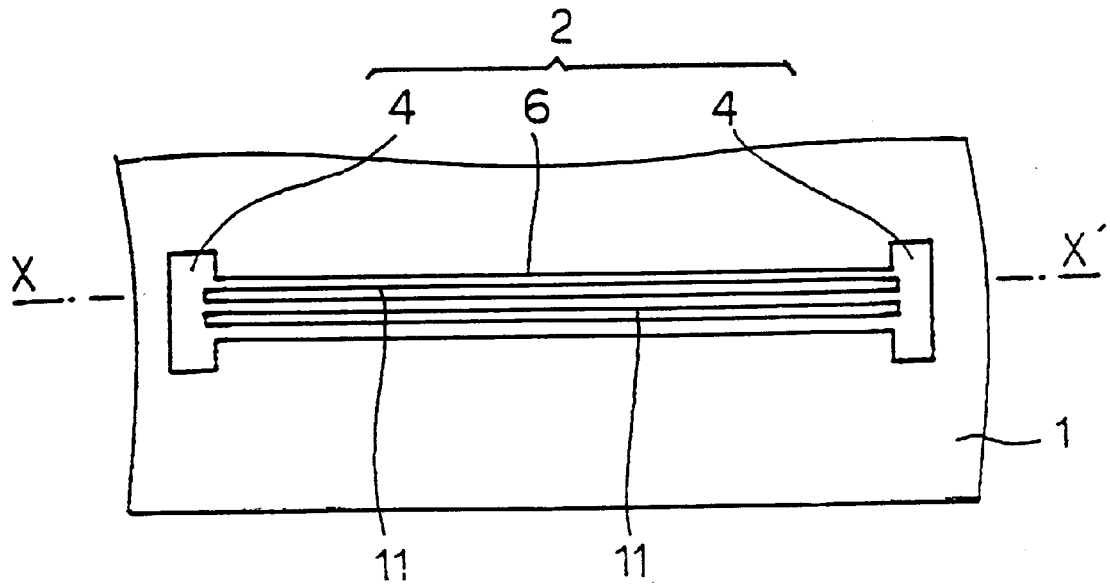
FIG. 3A is a part of an enlarged top view of a typical wiring pattern formed on the front surface of a printed circuit board according to a second embodiment of the present invention.
Figure 3B:
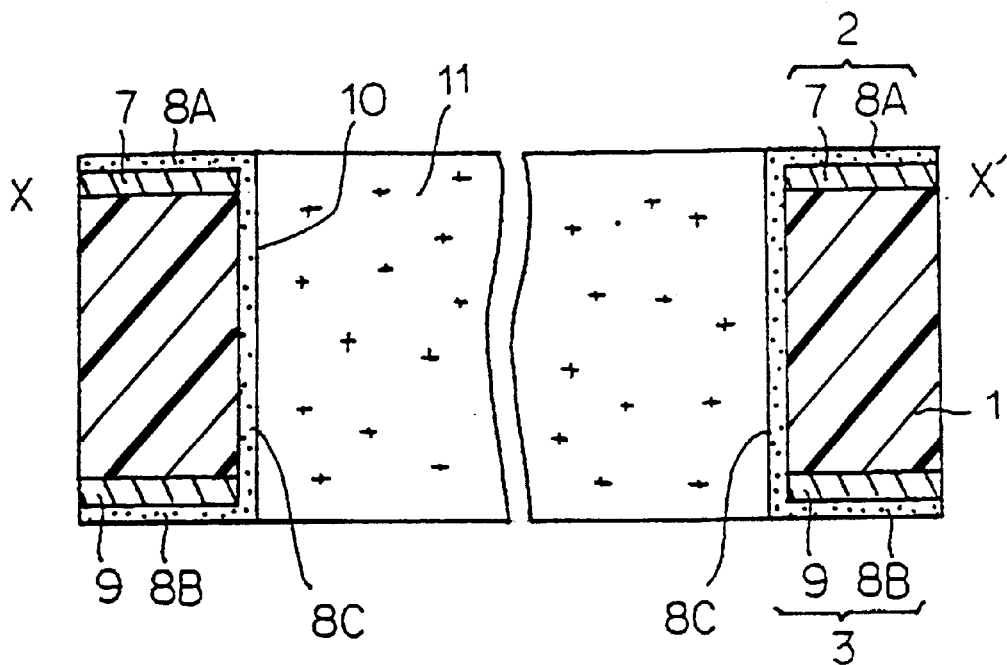
FIG. 3B is a part of an enlarged view of a cross section taken on line X–X' shown in FIG. 3A.

The configuration of another printed circuit board will be described below by referring to FIGS. 3A and 3B. Since the configuration is the same as that of the printed circuit board described above except that the openings 10 have slit shapes, only the openings 10 will be described below.

An insulating board 1 is provided with a plurality of long and narrow openings 10 which have a width of several millimeters or less and which extend in the longitudinal direction through a front wiring pattern 2 and a rear wiring pattern 3. The openings 10 are formed by using a laser beam, by cutting physically, or by punching with the use of a metal die. The openings 10 are also provided with electrically conductive layers, such as plated layers 8C, at the inner walls. The openings 10 are filled with solder 11 to form electrically conductive fillings.

As a result, the current capacity of the wiring patterns in the printed circuit board becomes larger, and the electrically conductive fillings serve as current paths to reduce the copper loss of the wiring patterns. The solder 11 with which the openings 10 are filled has a larger volume than the electrically conductive fillings shown in FIGS. 2A and 2B, and it works more effectively as a heat sink. As a result, the front wiring pattern 2 is prevented from generating heat.

What is claimed is:

1. A printed circuit board, comprising:
   an insulating board having opposing front and back surfaces;
   a front wiring pattern formed on said front surface, said front wiring pattern including at least one longitudinally extending section;
   a rear wiring pattern formed on said rear surface, said rear wiring pattern including at least one longitudinally extending section;
   one of said sections of said front wiring pattern opposing a corresponding one of said sections of said rear wiring pattern to form an opposing pair of longitudinally extending wiring pattern sections, each section of said pair being located opposite to and having substantially the same shape and size as the other section of said pair;
   a plurality of openings extending through said insulating board and penetrating both sections of said pair; and
   an electrically and thermally conductive material filling said openings so as to electrically and thermally couple said pair of wiring pattern sections.

2. The printed circuit board of claim 1, wherein said openings are spaced apart from one another along the longitudinal direction of said pair of wiring pattern sections.

3. The printed circuit board of claim 1, wherein said openings are spaced apart from one another along a direction which is substantially perpendicular to said longitudinal direction of said pair of wiring pattern sections.

4. The printed circuit board of claim 3, wherein said opening are elongated in the longitudinal direction of said pair of wiring pattern sections.

5. The printed circuit board of claim 4, wherein said openings are coextensive with one another.

6. The printed circuit board of claim 1, further including a respective electrically conductive layer formed on an inner surface of each of said opening so as to electrically couple said pair of wiring pattern sections, said electrically and thermally conductive material being in contact with said electrically conductive layers.

7. The printed circuit board of claim 6, wherein said openings are spaced apart from one another along the longitudinal direction of said pair of wiring pattern sections.

8. The printed circuit board of claim 6, wherein said openings are spaced apart from one another along a direction which is substantially perpendicular to said longitudinal direction of said pair of wiring pattern sections.

9. The printed circuit board of claim 8, wherein said opening are elongated in the longitudinal direction of said pair of wiring pattern sections.

10. The printed circuit board of claim 9, wherein said openings are coextensive with one another.

11. The printed circuit board of claim 1, wherein the thickness of said wiring patterns is less than or equal to 70 μm.

12. The printed circuit board of claim 1, wherein said electrically and thermally conductive material is solder.

13. The printed circuit board of claim 12, wherein said electrically and thermally conductive material acts as a heat sink.

14. A printed circuit board, comprising:
an insulating board having opposed front and back surfaces;
a front wiring pattern formed on said front surface, said front wiring pattern including at least one longitudinally extending section;
a rear wiring pattern formed on said rear surface, said rear wiring pattern including at least one longitudinally extending section;
a plurality of said sections of said front wiring pattern opposing a corresponding plurality of said sections of said rear wiring pattern to form a plurality of longitudinally extending opposing pairs of wiring pattern sections, each pair of wiring pattern sections comprising a respective section of said front wiring pattern and a respective section of said rear wiring pattern, each section of a given pair being located opposite to and having substantially the same shape and size as the other section of said pair;
for each pair of wiring pattern sections, a respective plurality of openings extending through said insulating board and penetrating both wiring pattern sections of such pair; and
an electrically and thermally conductive material filling said openings so as to electrically and thermally couple said pairs of wiring pattern sections.

15. The printed circuit board of claim 14, further including a respective electrically conductive layer formed on an inner surface of each of said opening so as to electrically couple said pair of wiring patterns, said electrically and thermally conductive material being in contact with said electrically conductive layers.

16. The printed circuit board of claim 15, wherein, for each said pair of wiring pattern sections, said openings are spaced apart from one another along the longitudinal direction of said pair of wiring pattern sections.

17. The printed circuit board of claim 14, wherein, for each said pair of wiring pattern sections, said openings are spaced apart from one another along the longitudinal direction of said pair of wiring pattern sections.

18. The printed circuit board of claim 15, wherein, for each said pair of wiring pattern sections, said openings are spaced apart from one another along a direction which is substantially perpendicular to said longitudinal direction of said pair of wiring pattern sections.

19. The printed circuit board of claim 18, wherein, for each such pair of wiring pattern sections, said opening are elongated in the longitudinal direction of said pair of wiring pattern sections.

20. The printed circuit board of claim 19, wherein, for each such pair of wiring pattern sections, said openings are coextensive with one another.

21. The printed circuit board of claim 14, wherein, for each said pair of wiring pattern sections, said openings are spaced apart from one another along a direction which is substantially perpendicular to said longitudinal direction of said pair of wiring pattern sections.

22. The printed circuit board of claim 21, wherein, for each such pair of wiring pattern sections, said opening are elongated in the longitudinal direction of said pair of wiring pattern sections.

23. The printed circuit board of claim 22, wherein, for each such pair of wiring pattern sections, said openings are coextensive with one another.

24. The printed circuit board of claim 14, wherein the thickness of said wiring patterns is less than or equal to 70 μm.

25. The printed circuit board of claim 14, wherein said electrically and thermally conductive material is solder.

26. The printed circuit board of claim 25, wherein said electrically and thermally conductive material acts as a heat sink.

* * * * *